(12) United States Patent
Smith et al.

(10) Patent No.: US 9,390,066 B2
(45) Date of Patent: Jul. 12, 2016

(54) PRECISION MEASUREMENT OF WAVEFORMS USING DECONVOLUTION AND WINDOWING

(75) Inventors: Paul Reed Smith, Annapolis, MD (US);
Jack W. Smith, Belle Haven, VA (US);
Ernestine M. Smith, legal representative, Belle Haven, VA (US);
Frederick M. Slay, Okatie, SC (US)

(73) Assignee: Digital Harmonic LLC, Ellicott City, MD (US)

( * ) Notice: Subject to any disclaimer, the term of this patent is extended or adjusted under 35 U.S.C. 154(b) by 497 days.

(21) Appl. No.: 13/509,427

(22) PCT Filed: Nov. 11, 2010

(86) PCT No.: PCT/US2010/056352
§ 371 (c)(1),
(2), (4) Date: Jul. 11, 2012

(87) PCT Pub. No.: WO2011/060145
PCT Pub. Date: May 19, 2011

(65) Prior Publication Data
US 2013/0046805 A1    Feb. 21, 2013

Related U.S. Application Data

(60) Provisional application No. 61/379,100, filed on Sep. 1, 2010.

(30) Foreign Application Priority Data

Nov. 12, 2009  (WO) ................ PCT/US2009/064120

(51) Int. Cl.
*G06F 17/14*    (2006.01)
*G10L 25/00*    (2013.01)
*G10L 25/18*    (2013.01)

(52) U.S. Cl.
CPC .............. *G06F 17/141* (2013.01); *G06F 17/14* (2013.01); *G10L 25/00* (2013.01); *G10L 25/18* (2013.01)

(58) Field of Classification Search
CPC ....................................................... G06F 17/14
USPC .................................................. 708/400–405
See application file for complete search history.

(56) References Cited

U.S. PATENT DOCUMENTS

| 4,797,923 A | 1/1989 | Clarke |
| 4,884,229 A | 11/1989 | Dekker |

(Continued)

FOREIGN PATENT DOCUMENTS

| EP | 0 847 153 A3 | 7/1999 |
| EP | 1 184 670 A2 | 3/2002 |

(Continued)

OTHER PUBLICATIONS

Fladung, W. et al, Application and Correction of the Exponential Window for Frequency Response Functions, 1997, Mechanical Systems and Signal Processing, vol. 11, Issue 1, pp. 23-36.*

(Continued)

*Primary Examiner* — Andrew Caldwell
*Assistant Examiner* — Calvin M Brien
(74) *Attorney, Agent, or Firm* — Sterne, Kessler, Goldstein & Fox PLLC

(57) ABSTRACT

The invention consists of new ways of constructing a Measuring Matrices (MMs) including time deconvolution of Digital Fourier Transforms DFTs. Also, windowing functions specifically designed to facilitate time deconvolution may be used, and/or the DFTs may be performed in specific non-periodic ways to reduce artifacts and further facilitate deconvolution. These deconvolved DFTs may be used alone or correlated with other DFTs to produce a MM.

15 Claims, 4 Drawing Sheets

(56) References Cited

U.S. PATENT DOCUMENTS

| | | | |
|---|---|---|---|
| 5,640,490 A * | 6/1997 | Hansen et al. | 704/254 |
| 5,780,759 A | 7/1998 | Szalay | |
| 6,766,288 B1 | 7/2004 | Smith | |
| 6,798,886 B1 | 9/2004 | Smith et al. | |
| 7,003,120 B1 | 2/2006 | Smith et al. | |
| 7,788,066 B2 | 8/2010 | Taenzer et al. | |
| 8,050,397 B1 | 11/2011 | Read | |
| 8,620,976 B2 | 12/2013 | Smith et al. | |
| 2001/0045153 A1 | 11/2001 | Alexander et al. | |
| 2003/0061035 A1 | 3/2003 | Kadambe | |
| 2003/0223354 A1 | 12/2003 | Olszewski | |
| 2004/0243657 A1 | 12/2004 | Goren et al. | |
| 2005/0265431 A1 * | 12/2005 | Pietila et al. | 375/147 |
| 2006/0111801 A1 | 5/2006 | Weare et al. | |
| 2006/0265218 A1 | 11/2006 | Samadani | |
| 2007/0286430 A1 * | 12/2007 | Thomas et al. | 381/71.12 |
| 2008/0019538 A1 * | 1/2008 | Kushner et al. | 381/94.1 |
| 2008/0034870 A1 | 2/2008 | Kurt-Elli | |
| 2008/0085008 A1 * | 4/2008 | Vickers | G10H 1/0091 381/63 |
| 2008/0228470 A1 * | 9/2008 | Hiroe | G10L 21/0272 704/200 |
| 2009/0285409 A1 | 11/2009 | Yoshizawa et al. | |
| 2012/0041994 A1 | 2/2012 | Smith et al. | |
| 2013/0191062 A1 | 7/2013 | Smith et al. | |
| 2014/0351302 A1 | 11/2014 | Smith et al. | |

FOREIGN PATENT DOCUMENTS

| | | |
|---|---|---|
| JP | 3174777 B2 | 3/2001 |
| JP | 2003-131688 A | 5/2003 |
| JP | 2006-048195 A | 2/2006 |
| JP | 2006-251712 A | 9/2006 |
| JP | 2007-304445 A | 11/2007 |
| JP | 2008-310138 A | 12/2008 |
| JP | 2009-169439 A | 7/2009 |
| WO | WO 2008/056649 A1 | 5/2008 |
| WO | WO 2011/060130 | 5/2011 |

OTHER PUBLICATIONS

Jensen, Kristoffer, Timbre Models of Musical Sounds, 1999, Department of Computer Sciences at the University of Copenhagen (DIKU), pp. 1-223.*

NIST, National Institute of Standards and Technology, Double Exponential Smoothing, Oct. 17, 2000, pp. 1-2.*

Wikipedia, en.wikipedia.org, Exponential Smoothing, Oct. 17, 2007, pp. 1-3.*

Wu, Zhaohua et al, Ensemble Empirical Mode Decomposition: A Noise Assisted Data Analysis Method, Aug. 2005, pp. 1-49.*

Casey, C.A., "Auditory Group Theory with Applications to Statistical Basis Methods for Structured Audio," *Submitted to the Program in Media Arts and Sciences, School of Architecture and Planning in Partial Fulfillment of the Requirements for the Degree of Doctor of Philosophy*, p. 1-180, Massachusetts Institute of Technology, United States (1998).

De Haan, J.M., "A Survey on Methods for Time-Frequency Analysis," *Master of Science program in Electrical Engineering*, p. 1-106, University of Karlskrona/Ronneby Department of Signal Processing, Sweden (1998).

Özbek, M.E., et al., "Musical Note and Instrument Classification with Likelihood-Frequency-Time-Analysis and Support Vector Machines," *Proceedings of the 15th European Signal Processing Conference*, p. 941-945, EURASIP, Poland (2007).

Regalia, P. A., et al., "The Digital All-Pass Filter: A Versatile Signal Processing Building Block," *Proceedings of the IEEE* 76(1):19-37, Institute of Electrical and Electronics Engineers, United States (1988).

Sawada, H., et al., "Spectral Smoothing for Frequency-Domain Blind Source Separation," *Proceedings of the International Workshop on Acoustic Echo and Noise Control*, p. 311-314, Japan (2003).

International Search Report and Written Opinion of the International Searching Authority directed to related International Patent Application No. PCT/US2009/064120, mailed Jan. 12, 2010, from the International Searching Authority; 8 pages.

International Search Report and Written Opinion of the International Searching Authority directed to related International Patent Application No. PCT/US2010/056333, mailed Jan. 21, 2011, from the International Searching Authority; 6 pages.

International Search Report and Written Opinion of the International Searching Authority directed to related International Patent Application No. PCT/US2010/056352, mailed Jan. 26, 2011, from the International Searching Authority; 9 pages.

International Preliminary Report on Patentability directed to related International Patent Application No. PCT/US2010/056352, mailed May 24, 2012, from the International Searching Authority; 7 pages.

International Preliminary Report on Patentability directed to related International Patent Application No. PCT/US2010/056333, mailed May 24, 2012, from the International Searching Authority; 6 pages.

U.S. Appl. No. 61/118,198, Smith et al., "Precision Measuring Matrix," filed Nov. 26, 2001.

Gasior, M., et al., "Improving FFT Frequency Measurement Resolution by Parabolic and Gaussian Interpolation," European Organization for Nuclear Research, CERN—AB Division, AB-Note-2004-02I BDI; 16 pages.

Vincent, E., "Musical Source Separation Using Time-Frequency Source Priors," IEEE Transactions on Audio, Speech and Language Processing, vol. 14, No. 1, Jan. 2006; 8 pages.

Supplemental European Search Report directed to related European Patent Application No. 09851007.6-1507, mailed Oct. 6, 2014; 7 pages.

* cited by examiner

| Time Slice \ Frequency Bin | 609.4 | 625.0 | 640.6 | 656.3 | 671.9 | 687.5 |
|---|---|---|---|---|---|---|
| 157 | -74.7 | -77.6 | -74.3 | -60.9 | -50.0 | -46.1 |
| 158 | -78.3 | -78.8 | -72.3 | -57.4 | -48.6 | -47.7 |
| 159 | -74.5 | -84.0 | -71.3 | -54.8 | -42.6 | -52.1 |
| 160 | -71.2 | -72.7 | -68.7 | -52.9 | -49.9 | -61.4 |
| 161 | -75.6 | -66.6 | -61.9 | -52.0 | -52.6 | -59.9 |
| 162 | -79.7 | -64.9 | -57.7 | -52.9 | -55.4 | -61.6 |
| 163 | -82.4 | -63.5 | -56.8 | -55.5 | -58.6 | -73.7 |
| 164 | -72.2 | -61.2 | -59.3 | -60.4 | -61.7 | -67.9 |

FIG. 2

PRECISION MEASUREMENT OF WAVEFORMS USING DECONVOLUTION AND WINDOWING

CROSS-REFERENCE TO RELATED APPLICATIONS

The present application claims the benefit of priority to U.S. Application Ser. No. 61/379,100, filed Sep. 1, 2010, and PCT Patent Application No. PCT/US2009/064120 filed Nov. 12, 2009, the contents of which are incorporated herein by reference in their entirety.

FIELD OF THE INVENTION

The invention relates to the time-frequency-amplitude analysis and measurement of waveforms and compound waveforms. Note that the word "signal" is a popular synonym for the more general "waveform" and both may be used interchangeably here. A compound waveform consists of multiple waveforms (or signals) mixed together. While most of this document refers to the audio frequency range, a waveform for the purposes of this invention is not limited to any particular frequency range or complexity. Any technology which measures waveforms/signals as part of its process may be assisted by this machine and process.

BACKGROUND OF THE INVENTION

Given a compound waveform, it is desirable to accurately measure the waveform and its components, which may have been spawned by several sources. This is difficult when the waveform includes signals produced by different sources overlapping in time and frequency, low energy signals eclipsed by higher energy signals, rapid changes in frequency, and/or rapid changes in amplitude. If these waveforms could be more accurately measured and analyzed, it would greatly increase our ability to understand what these waveforms contain and how to separate and/or modify them.

Analysis of waveforms is traditionally accomplished in the time and frequency domains. Typically, these waveforms are first captured digitally as amplitude samples in time, then a series of transforms are used to measure the signals and the result is displayed in a time, frequency and amplitude matrix. A variety of techniques have been developed to extract time/frequency/amplitude information from the time-series data. However, representing how the frequency and amplitude change with respect to time can be challenging, particularly when there are abrupt frequency and/or amplitude changes, or signals from multiple sources occupy the same time and frequency regions.

One common transform for obtaining time, frequency, and amplitude information is the Discrete Fourier Transform (DFT). Unfortunately, there is a tradeoff between frequency and time resolutions resulting from the size (dimension) of the DFT. The time window inspected by a DFT is proportional to its dimension. Thus, a large dimension DFT inspects a larger time window than a small dimension DFT. This larger time window makes a large dimension DFT slow to react to dynamic changes.

Conversely, a large dimension DFT slices up the frequency range into finer segments. The maximum frequency measured by the DFT is half the sampling rate of the digitized signal. A DFT of dimension X divides the frequency range from 0 to the max into X/2 equal sized "bins." Thus, the size of each frequency bin in a DFT is equal to the sampling rate divided by its dimension.

So, higher dimension DFTs have higher frequency resolution but lower time resolution. Lower dimension DFTs have higher time resolution but lower frequency resolution. Because of this tradeoff, practitioners have sought modified DFTs or other alternative methods to accurately represent dynamic, time-varying waveforms with good resolution in both time and frequency. The Precision Measuring Matrix (PMM) (US Patent application No. PCT/US2009/064120) is just such a method. This invention extends the PMM method.

Fast Fourier Transforms (FFTs) are typically used to perform convolutions and deconvolutions. The Convolution Theorem states that under suitable conditions the Fourier transform of a convolution of two functions is the pointwise product of the Fourier transforms of the functions. It is usually simpler (and faster) to transform two functions, multiply them, and transform back than to perform a brute force convolution. More to the point, it is dramatically simpler and faster to use the convolution theorem when deconvolving. Brute force deconvolution involves solving N equations in N unknowns. Transforming the two functions, dividing, and transforming back is much easier. Brute force deconvolution is not only computationally daunting, it can be impossible. When deconvolving a series of numbers, the result is often unstable. Thus, deconvolution is, in practice, virtually always done using transforms.

The inventors have been issued several patents, which are hereby incorporated by reference. They are: Fast Find Fundamental Method, U.S. Pat. No. 6,766,288 B1; Method of Modifying Harmonic Content of a Complex Waveform, U.S. Pat. No. 7,003,120 B1; and Method of Signal Shredding, U.S. Pat. No. 6,798,886 B1. Application No. PCT/US2009/064120 filed Nov. 12, 2009 is also hereby incorporated by reference.

SUMMARY

Embodiments of the invention provide a machine-implemented method for digital signal processing, comprising: obtaining a digital signal from conversion of an analog signal or from data storage; constructing MMs (as per Patent Application No. PCT/US2009/064120) comprised of cells containing the amplitudes for particular times and frequencies with marked correlated maxima.

In accordance with the disclosed embodiments, a new way of constructing MMs is provided which utilizes time deconvolution of FFTs and the use of windowing functions specifically designed to facilitate time deconvolution. FFTs may be performed in non-periodic ways to reduce artifacts and further facilitate deconvolution. These deconvolved FFTs may be used alone as a MM or may be correlated with other FFTs (either deconvolved or not) to produce a PMM.

BRIEF DESCRIPTION OF THE DRAWINGS

FIG. 2 shows a view of an example measuring matrix with simple maxima marked according to an exemplary embodiment of the invention.

Figure 1:
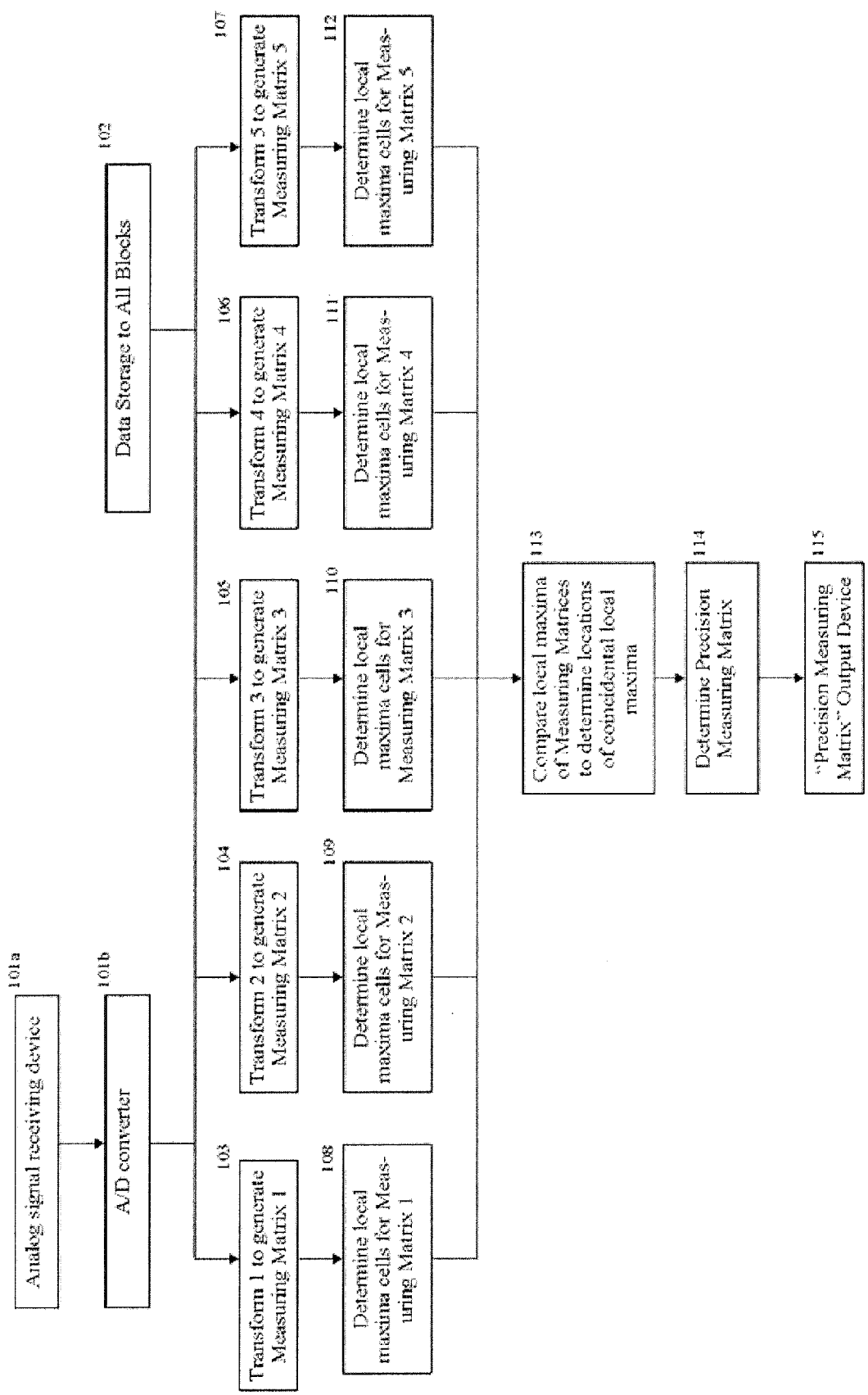
FIG. 1 shows a schematic diagram for forming a PMM according to an exemplary embodiment of the invention.

As explained above, disclosed embodiments provide new ways of identifying related cells in PMMs constructed based on an obtained digital signal. As explained in Application No.

PCT/US2009/064120, PMMs are comprised of cells containing the amplitudes for particular times and frequencies with marked correlated maxima. Identifying related cells using domain relationships of the maxima and partial chains of maxima in the PMMs enables one to identify and separate sound sources within a complex compound waveform. Thus, new ways of identifying related cells in PMMs have significant utility and practical applications.

Preliminary to an in depth discussion of the disclosed embodiments, it should be understood that, broadly speaking, PMMs are constructed by performing a plurality of FFTs (or their equivalent) on to generate Measuring Matrices (MMs), which are matrices of cells representing the spectral amplitude of a digital signal to be analyzed. Thus, each FFT creates, for a particular time slice, a row or column of cells (one cell for each frequency bin).

A PMM is a matrix of time, frequency and amplitude events generated from the MM with correlated maxima marked as described in Patent Application No. PCT/US2009/064120. It should be appreciated that, where necessary, the generated MMs may be stretched to provide overlap to ensure that there is appropriate coverage throughout the PMM as explained in that patent application.

In accordance with the present disclosure, a new way of constructing MMs is provided which utilizes time deconvolution of FFTs and the use of windowing functions specifically designed to facilitate time deconvolution. FFTs may be performed in non-periodic ways to reduce artifacts and further facilitate deconvolution. These deconvolved FFTs may be used alone as a MM or may be correlated with other FFTs (either deconvolved or not) to produce a PMM.

Thus, the disclosed embodiments are contrary to that of conventional use of FFTs because, instead of using FFTs to do deconvolutions, disclosed embodiment utilize deconvolution to perform FFTs (or, more specifically, to improve the FFTs).

As should be understood from the following detailed explanations, some windowing functions improve ease with which FFT output can be deconvolved. For example, N equations in N unknowns may simplify to a recursive formula that involves only totaling a few terms. Furthermore, if the windowing function is asymmetric, with the more recent samples getting the greater weight, the deconvolution may become stable.

Accordingly, disclosed embodiments of the invention deconvolve the output of a series of FFTs, while using specific windowing functions to make the FFT easier and better behaved; in addition, the FFTs may be performed at opportunistic times so as to reduce the FFT artifacts.

With this preliminary and generalized explanation of the disclosed embodiments in mind, the following provides more specific definitions of various terms used in the followed detailed description.

DEFINITIONS

The following definitions are used herein.

FT: Fourier Transform—an algorithm that computes the amplitudes of the spectrum for a waveform.

DFT: Discrete Fourier Transform—an algorithm that computes the amplitudes of the spectrum for a discrete (digitized) waveform. The DFT output can be a complex number or just the real amplitude. Many of the preferred embodiments of this invention only need the real amplitude. Unless specifically described as complex, all references to DFTs herein are for DFTs with real output.

FFT: Fast Fourier Transform—a fast running DFT method that is so popular that its name is often used synonymously with DFT. DFT and FFT are used interchangeably herein.

Window: The portion of time used by a Fourier Transform (or equivalent technique). In a DFT the window size (in samples) is known as the dimension of the DFT. For example, if a signal is digitized with 8000 samples per second, a DFT with a dimension of 4000 will operate on 4000 samples (one half-second) of data.

Windowing Technique: A popular DFT method whereby the samples within the window are not all treated equally. For example, a simple DFT with dimension 4000 will simply transform the 4000 samples. With a windowing technique, the 4000 samples will be modulated to give more weight to the samples in the middle and less weight to the samples at the beginning and the end. Windowing techniques are designed to reduce the side lobes/artifacts in the DFT's frequency response.

dB: decibel—logarithmic ratio of measurement used in, for example, acoustics and electronics measurements and calculations.

dBFS: dB Full Scale—DB relative to the maximum peak level in the digital representation.

Time Slice: A portion of time. A time slice may, for example, be represented by an FFT run on a particular time window of data. However, the window will typically be much larger than the time slice it represents and centered on the time slice. The size of the time slices is determined by the spacing between successive FFT runs, not by the size of the window. For a digitized signal with 8000 samples per second, if a new FFT is run every 8 samples, then the time slices are 8 samples (1 millisecond) wide. The FFT window might be 4000 samples (a half-second or 500 time slices) wide.

Frequency Bin: A small range of frequencies (e.g. 1702-1704 Hz)

Cell: A unit in a matrix. Typically, a cell represents a frequency bin in a time slice and contains an amplitude in dBFS.

MM: Measuring Matrix—A matrix of cells representing the spectral amplitude of a waveform over time. A measuring matrix is generated by repeated FFTs (or the equivalent). Each FFT creates, for its time slice, a row (or column) of cells—one cell for each frequency bin. The amplitude in each cell is the amplitude for that frequency bin in that time slice. The cells are then inspected and marked, as appropriate, as maxima. A measuring matrix can be of infinite length, when processing a continuous signal in near real time. For a limited time waveform, a measuring matrix can be of finite length. For convenience and clarity, a time slice in a measuring matrix is a row. Hereafter, the word "row", if used without any explanation, means the portion of a measuring matrix representing a time slice (or, in some cases, a time interval such as single sample of the signal).

Maximum Cell: A cell marked as having one or more types of maxima.

Simple Maximum Cell: A cell whose amplitude is greater than the cells immediately adjacent. If a cell's amplitude is greater than that of the cells in the same time slice that are just above it and just below it in frequency, the cell is a frequency peak simple maximum. If a cell's amplitude is greater than that of the cells in the same frequency bin that are just before it and just after it in time, the cell is a time peak simple maximum. A single cell can be both a time and frequency simple maximum. Time peak and frequency peak simple maximum cells may be distinctly marked or may be treated as synonymous and just called "simple maximum cells," or, "simple maxima," for short.

Associated Maximum ("Little Brother") Cell: A cell adjacent to a simple maximum whose amplitude is within a designated threshold of the simple maximums and also greater than that of the cell on the other side. If a cell is a frequency peak simple maximum, the cells in the same time slice that are just above and below the simple maximum in frequency are candidates for associated maxima. If a cell is a time peak simple maximum, the cells in the same frequency bin that immediately precede it and succeed it are candidates for associated maxima. In an exemplary embodiment, if the amplitude in the candidate cell preceding a simple maximum is within 2 dB of the simple maximum's amplitude and also greater than the amplitude of the cell that precedes it, then it would be marked as a little brother. In an exemplary embodiment, if the amplitude in the candidate cell just above the simple maximum in frequency is within 3 dB of the simple maximum's amplitude and also greater than the amplitude of the cell just above it in frequency, then it would be marked as a little brother. The dB thresholds for little brothers adjacent in time need not be the same as for little brothers adjacent in frequency. Time and frequency little brothers may be distinctly marked or may be treated as synonymous and marked simply as little brothers. A single cell can be both.

PMM: Precision Measuring Matrix—A MM with correlated maxima marked. (Now, in accordance with embodiments of this disclosure, any MM with precision maxima marked. Such precision maxima may be found without correlating multiple MMs, when a single MM is of sufficiently high precision, through deconvolution.)

Preliminary to the more detailed description of embodiments of this disclosure, a summary review of supporting technology provided in previously filed Application No. PCT/US2009/064120 (incorporated by reference) is provided to fully disclose the context of the embodiments. In accordance with the embodiments of that previously filed disclosure, a machine-implemented method for digital signal processing is provided. That method, as shown in FIG. 1 is a machine-implemented method for digital signal processing, comprising: obtaining a digital signal from conversion of an analog signal or from data storage at 101a, b; 102; constructing one or more MMs comprised of cells containing the amplitudes for particular times and frequencies at 103-107; marking maxima in these matrices based on comparisons of the cell amplitudes at 108-112; and relating those maxima to find correlated maxima, where multiple maxima agree in both time and frequency at 113. A new matrix, called a PMM, is generated with the correlated maxima marked at 114 and outputting the PPM at 115. (Note: all these maxima are local maxima but, for brevity, we refer to them simply as "maxima.")

Each MM is typically generated by repeated transformation of the input signal using, for example, an FFT. Each transformation represents a portion of time, called a time slice, in the input signal and has a row of cells, each cell corresponding to a frequency range, called a frequency bin. Each cell is populated with an amplitude, representing the signal strength for its corresponding frequency bin/time slice. Cells in each MM having maximum amplitudes within preferably each time slice and/or frequency bin are identified and marked. Many methods for identifying maxima may be used, yielding many types of maxima.

FIG. 2 shows a view of an example measuring matrix produced by blocks 103-107 of FIG. 1 with simple maximum cells marked by blocks 108-112 of FIG. 1. In this example, a row is a time slice, and a column is a frequency bin. The number in each cell is the corresponding amplitude measurement (in dBFS).

The frequency peak simple maximum cells are marked with a dark border and the time peak simple maximum cells are marked with a grey background. For example, frequency peak simple maxima may be cells in a time slice in an MM having an amplitude that exceeds that of the two adjacent cells in frequency. Thus, for example, in FIG. 2, cell (160, 671.9) is marked as a frequency peak simple maximum (with a dark border) because it has an amplitude that is greater than its adjacent cells (160, 656.3) and (160, 687.5).

Similarly, time peak simple maximum cells are cells with local maximum amplitude within a particular frequency bin. Thus, for example, in FIG. 2, cell (159, 671.9) is marked as a time peak simple maximum (with a shaded background) because it has an amplitude greater than that of the adjacent cells (158, 671.9) and (160, 671.9).

Although little brothers are not marked in FIG. 2, the data provides some indication of where they might be. For example, assuming a 3 dB threshold for little brothers, note that cell (160, 671.9) is marked with a dark border as a frequency peak simple maximum cell while adjacent cells (160, 656.3) and (160, 687.5) are candidates for associated maximum cells; however, only cell (160, 656.3) is close enough in amplitude to qualify as an associated maximum (within 3 dB). Because the amplitude of that cell is also greater than that of cell (160, 640.6), it may be a little brother.

This same determination may be made for associated maximum cells in a time slice. Thus, maxima in various matrices and/or of various types that coincide in time and frequency may be marked in a PMM. Adjacent correlated maxima in the PMM may then be linked together as partial chains.

It should also be understood that a maximum cell may be identified by comparing its amplitude with the amplitudes of adjacent cells or by comparing the amplitudes of other specifically related cells. A cell is a simple maximum cell if the amplitude of the cell is greater than the amplitudes of its adjacent cells. Other types of maxima may include: associated "little brother" maxima, angle maxima, and burglar maxima. If multiple maxima are found for the same time slice and frequency bin (for example, in different MMs), then the maxima may coincide; as a result, the corresponding cell in the PMM may be marked as a correlated maximum.

The amplitude in each cell in the PMM is populated with a function of the values in the corresponding cells in the originating MMs (e.g., a weighted average).

Various MMs and PMMs may have high resolution and accuracy measurements for instantaneous frequency and amplitude of a time series signal. This may be accomplished by constructing multiple MMs of varying sizes, marking the maxima in the MMs, and then correlating the maxima. Smaller-sized transforms provide better time resolution while the larger-sized transforms provide better frequency resolution. For this reason, two or more measuring matrices (differing in time and frequency resolutions) may be used to build a PMM.

Adjacent maxima in a PMM can be linked into chains called partial chains. This linking is accomplished by connecting any two maximum cells in adjacent time slices that are in identical or close frequency bins.

In accordance with one disclosed embodiment, two MMs may be created using FFTs of different dimensions; simple maxima and little brothers (in both time and frequency) may be marked with, for example, a 2 dB threshold for the little brothers. In such an implementation, all four types of maxima (i.e., time or frequency, and simple or little brother) may be marked simply as "maxima."

The corresponding PMM may be created by comparing cells in the two MMs with matching time and frequency and marking maxima in the PMM where both have maxima. The cells in the PMM may then be populated with the average amplitude of the corresponding cells in the original MMs.

Alternative implementations and embodiments may be produced by variations of the above. For example, the time maxima may be eliminated and only frequency maxima may be used. Alternatively, the little brother threshold may be changed from 2 dB to any other value; moreover, the little brother maxima may be eliminated.

Furthermore, more than two MMs may be created and correlated to generate the PMM. When more than two MMs are used, the agreement between all of them need not be universal. For example, if five different MMs are used to generate the PMM, three out of five maxima at the same time and frequency may be required to identify a correlated maximum. Alternative determinations are also possible.

Moreover, rather than simply treating all maxima equally or of equal weight, a little brother may be treated differently from a simple maximum. It should also be appreciated that the criteria for a correlated maximum may be more complicated than simple counting or addition, rather, any mathematical formula is possible.

Additionally, a correlated maximum may be determined differently for different frequency ranges. Thus, for low frequencies, larger dimension MMs may be useful for increased frequency resolution. Conversely, for high frequencies, smaller dimension MMs may be sufficient, thereby improving efficiency and speed of analysis.

Thus, it should be appreciated that any combination of these variations may be used in an exemplary embodiment.

Moreover, any windowing technique might be used. Thus, multiple MMs can be generated using the same dimension FFT but different windowing techniques. Maxima may then be marked in these MMs (possibly with different marking criteria), and the MMs may then be compared to identify correlated maxima and build the PMM. Alternatively, multiple MMs may be produced using both different dimensions and different windowing techniques. Thus, it should be appreciated that the possible combinations are endless.

Figure 3:
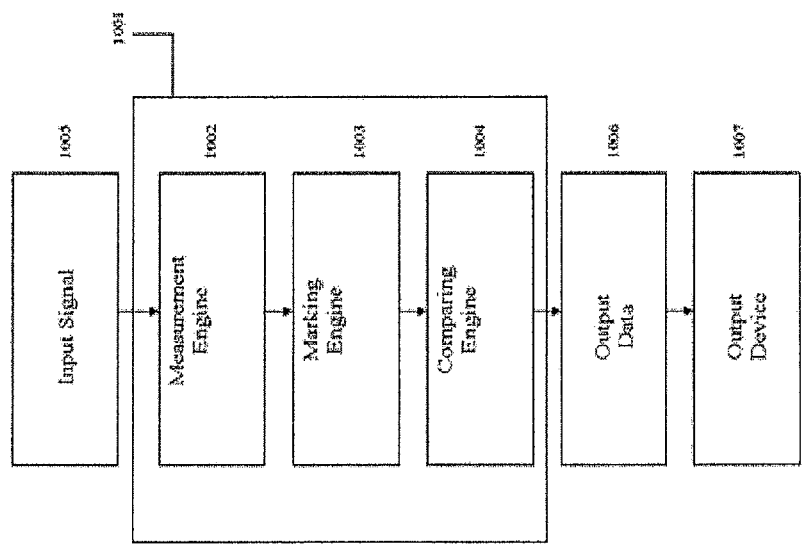
FIG. 3 illustrates an exemplary embodiment of one potential implementation of the invention.

In order to better understand the functionality explained in relation to FIG. 1, FIG. 3 provides an alternative representation of the operation of the components previously illustrated in FIG. 1 for providing the novel methodologies and functionality. As shown in FIG. 3, an input signal at 1005 is input to a signal processing module 1001. The module 1001 includes a measurement engine 1002, a marking engine 1003, and a comparing engine 1004, which effectively cooperate to produce a PMM.

It should be understand that each of these engines 1002-1004 included in the signal processing module 1001 (and the signal processing module 1001 itself) may be implemented utilizing one or more computers with at least one Central Processing Unit (CPU) and at least one memory device.

Further, the measurement engine 1002, marking engine 1003, and comparing engine 1004 may be implemented in whole or in part utilizing, for example, a Field Programmable Gated Array (FPGA), a Digital Signal Processing (DSP) chip, a Graphic Processing Unit (GPU), an Application Specific Integrated Circuit (ASIC), etc. Furthermore, the measurement engine 1002, marking engine 1003, and comparing engine 1004 may be implemented at least in part utilizing software modules (discussed above with reference to FIG. 1) as one or more engines and stored on computer-readable storage.

The PMM generated by the comparing engine 1004 may be provided as output data 1006. The output data 1006 may be provided to output module 1007 which stores, displays, and/or transmits the output data.

As explained throughout the present disclosure, the disclosed embodiments may be implemented utilizing software operating on one or more pieces of hardware, which may include, for example, a computer. Thus, the disclosed embodiments may run on a single processor with a single core, a single processor with multiple cores, or multiple processors with single or multiple cores. Furthermore, the software may run on one or more servers that interact with one or more user interfaces at one or more locations that may be remote to one another.

Furthermore, that software may implement the functionality disclosed herein with reference to the modules, components and engines illustrated in FIGS. 1 and 3. Some or all of the functionality provided by the disclosed embodiments may be provided using software, general or specialized digital signal processor chips, dedicated hardware, firmware, etc. Additionally, the functionality may be embodied on one or more circuit boards comprising, for example, digital signal processor chips, to be mounted in a computer or other module.

Furthermore, some functionality provided by the disclosed embodiments may be implemented using parallel computing hardware. Thus, for example, a main memory of a parallel processor computing device may be either shared memory (shared between all processing elements in a single address space), or distributed memory (in which each processing element has its own local address space).

Figure 4:
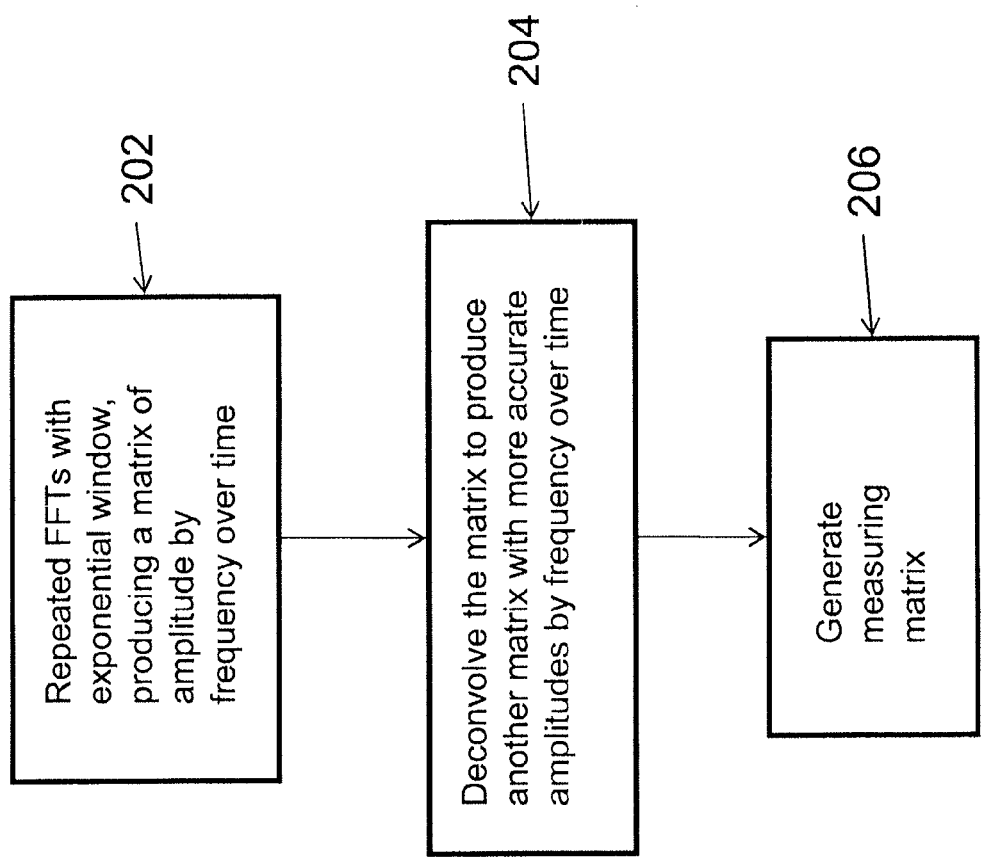
FIG. 4 shows a schematic diagram for forming a Measuring Matrix according to an exemplary embodiment of the invention.

In accordance with a disclosed embodiment, new ways of generating a MM may create a PMM as part of a new dynamic computer machine process that produces accurate amplitude and frequency information in relation to time. To better understand the utility of that disclosed embodiment, FIG. 4 provides an alternative theoretical model for the disclosed embodiment. Specifically, in accordance with the embodiment, a set of method operations are performed beginning at 202, wherein a transform performs a series of periodic FFTs on a signal to transform the input into the frequency domain. It should be understood that each FFT produces a set of amplitudes by frequency within a given time slice, as explained above with regard to FIG. 2. Subsequently, at 204, time deconvolution is performed to compare the cells in the matrix generated at 202 to produce another matrix, identical in shape but with the amplitudes in each cell computed based on the time deconvolution algebra. As a result, a matrix is generated which is more precise than the original, but otherwise identical in terms of what it represents and how it is used. Subsequently, at 206, an MM generator then marks the cells as depicted, for example, in FIG. 2.

The operations performed in FIG. 4 are identical to the creation of a measuring matrix in US Patent application No. PCT/US2009/064120 except that the present disclosure provides an additional deconvolution operation performed at 204 and may utilize exponential windowing of the FFT. Thus, the operations performed in FIG. 4 may be substituted for the dual-stage formation of the MM illustrated in FIG. 1, wherein operations are performed at, e.g., 103 and 108, 104 and 109, 105 and 110, etc. The increased utility provided by this disclosed embodiment may be best appreciated when it is recognized that a regular (i.e., non-deconvolved) FFT may actually be quite imprecise in frequency and/or time.

Deconvolution involves comparing an FFT's output with previous FFTs' outputs and solving algebraically for what is new in the most recent FFT's output. However, this can be a difficult (or even impossible) task, depending on the windowing function selected in the generation of the FFTs. Typical windowing functions (e.g., Hamming or Hanning) are not conducive to deconvolution. However, an asymmetric windowing function, particularly a decaying exponential or a function that ends in a decaying exponential, can be more easily deconvolved.

Conceptually, the simplest variation of deliberate selection of windowing function characteristics to optimize deconvolution is the use of an exponential window of infinite width. This is analogous to the exponential smoothing method used in statistics. More specifically, given a series of values ($X_T$), an exponentially smoothed average ($S_T$) can be produced by weighting the most recent $X_T$ more heavily. A smoothing constant $\alpha$ gives the weight given to the most recent value. Prior values may be given exponentially less weight going back in time. Thus:

$$S_T = \sum_{i=0}^{\infty} \alpha(1-\alpha)^i X_{T-i}$$

This can be reduced to the recursive formula:

$$S_T = \alpha X_T + (1-\alpha) S_{T-1}$$

Time deconvolution requires derivation of the X's from the S's as a function of time and across time slices, which is fairly straightforward by simply solving for $X_T$:

$$X_T = \frac{S_T - (1-\alpha)S_{T-1}}{\alpha}$$

Thus, if only the exponentially smoothed averages was known from, for example, a daily tracking poll leading up to an election, the actual daily polling figures used could be derived (assuming $\alpha$ was known). It should be appreciated, however, that actual tracking polls typically use a simple moving average which is, in practice, impossible to deconvolve.

Continuing with the analogy to statistical, exponential smoothing techniques, since an FFT window cannot be infinite, the recursive formula gets an extra term. When the sum is limited to N terms, the formula for $S_T$ becomes:

$$S_T = \alpha X_T + (1-\alpha) S_{T-1} - \alpha(1-\alpha)^N X_{T-N}$$

Hence, the deconvolved formula for $X_T$ gains a term too:

$$X_T = \frac{S_T - (1-\alpha)S_{T-1} + (1-\alpha)^N X_{T-N}}{\alpha}$$

However, because $(1-\alpha)^N$ may be very small, this extra term may actually be neglected. However, since $X_{T-N}$ is an earlier term (and thus known), it remains straightforward to include.

Successive FFTs can be treated analogously to this statistical, exponential smoothing technique. Thus, if a windowing function is exponential, each frequency bin in each new FFT output may be analogous to a new $S_T$. Thus, the $X_T$ is analogous to the "new" (or latest) portion of the FFT (for that frequency bin). This recognized relationship yields accurate time information from a long FFT (which, it should be understood, has accurate frequency information but inaccurate time information).

Unfortunately, the use of asymmetric windowing functions does a poor job of reducing artifacts inherent in FFTs, in particular, side-lobes. Windowing functions reduce artifacts by reducing the starting and ending amplitude of the signal being transformed. A decaying exponential reduces the ending amplitude but not the starting amplitude.

However, as recognized in an embodiment disclosed herein, one way around the problems associated with asymmetric windowing functions is to only perform FFTs at opportunistic times when the starting amplitude is small. Although disclosed embodiments of generating an MM may involve repeated FFTs performed at regular intervals (e.g., every 64 samples). Alternatively, the FFTs may be performed opportunistically, at irregular intervals, only being done when, for example, the signal crosses 0, so that the amplitude of a sample near that zero crossing is small. It should be noted that, in such an implementation, the dimension of all the FFTs must be the same, e.g., 4096, for the bins to be comparable. Thus, for example, an FFT might be performed at sample number 1000 (when the signal crossed 0), and the next FFT performed at sample 1109 (when the signal next crossed 0 again). That next FFT would represent a time slice of 109 samples, as it analyzed that many "new" samples of the signal. Also, 109 samples would have dropped off the "back" of that next FFT. Any deconvolution methodology would have to explicitly account for this.

When an MM is generated using FFTs performed opportunistically at irregular intervals, each row of the MM may represent one FFT (as shown in FIG. 2). However, since each row may not represent the same time slice, the size of the time slice represented by each row may have to be stored and dealt with in subsequent processing.

Alternatively, a separate row may be used for each sample. Thus, each new FFT may fill as many rows as the width of its time slice (109 rows in the example above). It should be noted that these operations and transformations are computer processing intensive but are also conceptually simple; as a result, the operations and transformations greatly simplify subsequent processing.

The many rows produced by each new FFT may be filled with identical values, or smoothing methods may be used so that the cell values do not jump abruptly from one FFT to the next.

Nevertheless, a time slice (e.g., including 109 samples in the above example) may be longer than desired. Since, in this disclosed embodiment, the length of a time slice may be determined by when the signal crosses zero, one further solution to the issue is to modify the signal to cross zero more often. This may be accomplished by reducing the low frequency information in the signal. More specifically, the signal may be pre-processed by feeding it through a high pass filter before performing the FFT. This high pass filter may be analog or digital.

In accordance with at least one disclosed embodiment, a windowing function may be selected that ends in a decaying exponential but begins with some simple function that starts small and ramps up in a way that is easily deconvolved (e.g., a linear function). Thus, a starting point may always have a small amplitude, thus reducing the side-lobes. This may enable successive FFTs to be performed at regular intervals.

It should be appreciated that any of the above-described techniques may be performed in reversed time as well. By combining the result obtained in forward time with the result generated in reverse time, further increased precision may be obtained.

Also, various windowing functions and different dimension FFTs may be combined, as per Patent Application No. PCT/US2009/064120.

In particular, the deconvolved FFTs may be of such precision that they alone may be used to produce more accurate amplitude values in a MM. Thus, cross correlation of different FFTs to form PMM may not be necessary. Therefore, the rest of the construction of the MM and PMM may be implemented using the approaches disclosed, for example, in Patent Application No. PCT/US2009/064120.

As explained above, with relation to FIGS. 1 and 3, the disclosed embodiments may be embodied by software on a digital computer machine. It may run on a single processor with a single core, a single processor with multiple cores, or multiple processors with single or multiple cores. The invention may be embodied using general or specialized digital signal processor chips. The invention may be embodied in dedicated hardware. The invention may be embodied on one or more circuit boards comprising, for example, digital signal processor chips, to be mounted in a computer or other device. Some or all of the functionality provided by the disclosed embodiments may be provided using software, general or specialized digital signal processor chips, dedicated hardware, firmware, etc. Additionally, the functionality may be embodied on one or more circuit boards comprising, for example, digital signal processor chips, to be mounted in a computer or other module.

Some functionality provided by the disclosed embodiments may be implemented using parallel computing hardware. Thus, for example, a main memory of a parallel processor computing device may be either shared memory (shared between all processing elements in a single address space), or distributed memory (in which each processing element has its own local address space).

Furthermore, disclosed embodiments may be implemented wherein the matrix data structure may be replaced by other data structures that can logically serve the same function. These data structures may be made up of fields and/or include, but are not limited to, for example, a sparse matrix, a linked queue, etc.

Moreover, there are many foreseeable variations, for example, identified maximum cells may be represented by a sparse matrix, an identified chain of cells may be represented by a linked queue, etc.

The invention may have a wide range of applications, including, but not limited to, for example, signal time-variance analysis including audio, audio spectrum analysis, signal analysis in an applicable industry in any frequency range, data compression, digital cochlea for the deaf, "voice print" information, etc.

The information developed by the invention may be used to provide new or improved inputs to other signal processors, analysis devices, algorithms, systems, and organizations. Records of related partial chains running across the time-frequency plane, together with the amplitudes or interpolated amplitudes along each chain, may provide a rich and concise record of the components of particular signal sources. Signals that were previously hidden by stronger signals may be measured and visualized, particularly when the partials are linked into partial chains in the PMM visual display.

Moreover, the functionality and technical effects provided by the disclosed embodiments may be utilized to provide new or improved inputs to other signal processors, analysis devices, algorithms, systems, and organizations. For example, records of related partial chains running across the time-frequency plane, together with the amplitudes or interpolated amplitudes along each chain, may provide a rich and concise record of the components of particular signal sources. Signals that were previously hidden by stronger signals may be measured and visualized, particularly when the partials are linked into partial chains in the PMM visual display.

Thus, the examples and embodiments described herein are non-limiting examples. The invention is described in detail with respect to exemplary embodiments, and to those skilled in the art will now be apparent from the foregoing that changes and modifications may be made without departing from the invention in its broader aspects, and the invention, therefore, as defined in the claims is intended to cover all such changes and modifications as fall within the true spirit of the invention.

Exemplary embodiments of the invention can be used to accurately measure sound components even when the sound components are part of a compound waveform containing a mixture of sounds. Exemplary embodiments of the invention may also be used, for example, for compound waveforms containing sounds even when the sounds come in short or long duration bursts and/or are changing in pitch and/or in amplitude.

The examples and embodiments described herein are non-limiting examples. The embodiments described in detail with respect to exemplary embodiments, and to those skilled in the art should be apparent from the foregoing that changes and modifications may be made without departing from the invention in its broader aspects, and the invention, therefore, as defined in the claims is intended to cover all such changes and modifications as fall within the true spirit of the invention.

Although the present invention has been described and illustrated in detail, it is to be clearly understood that this is done by way of illustration and example only and is not to be taken by way of limitation. The scope of the present invention is to be limited only by the terms of the appended claims.

What is claimed is:

1. A method implemented on a computer having one or more processors and one or more memory devices, the method comprising:

receiving an input signal in the form of a digital waveform signal, wherein the input signal comprises a plurality of amplitude values, and each amplitude value having a corresponding time value;

selecting, by a measurement engine, a series of overlapping time windows from the input signal, wherein each window has a beginning and an end, thereby defining time slices each indexed by an integer M, wherein a given time slice is a difference between the beginning of one window having index M and that of another having index M−1, or the difference between the end of one window having index M and that of another having index M−1;

transforming, by the measurement engine, using a decaying exponential windowing function on each time window in the series of overlapping time windows, the corresponding time and amplitude values into a plurality of transformed amplitude values, each associated with a corresponding frequency, to thereby form a first matrix indexed by the time slices and frequencies;

performing, by the measurement engine, time-domain deconvolution on the plurality of transformed amplitude values for each frequency index to thereby form a second matrix of deconvolved amplitude values indexed by the time slices and frequencies;

determining, by a comparing engine, a plurality of maxima and minima values in the second matrix;

marking, by a marking engine, the determined plurality of maxima and minima values to thereby form a measuring matrix indexed by the time slices and frequencies; and outputting the measuring matrix to thereby reveal information associated with the input signal, wherein outputting includes at least one of storing, displaying, or transmitting the measuring matrix; and wherein the engines are implemented using the one or more processors of the computer.

2. The method of claim 1, further comprising performing time-domain deconvolution, for each frequency index, by applying the following formula:

$$X_T = \frac{S_T - (1-\alpha)S_{T-1} + (1-\alpha)^N X_{T-N}}{\alpha},$$

wherein $S_T$ is a value of the first matrix, for a given frequency index, having time slice index T, $\alpha$ is a constant, and $X_T$ is a value of the second matrix having time slice index T and the same frequency index as $S_T$, and N is an integer, equal or greater than 1, denoting the number of time slices in the window.

3. The method of claim 1, further comprising selecting the plurality of time windows by choosing the beginning or end of each time slice to coincide with amplitude values that are smaller in magnitude than a predetermined constant, wherein a difference between the beginning and end of a time slice need not be the same for each time slice.

4. The method of claim 1, further comprising, for a given value of the frequency index of the second matrix, performing a weighted averaging operation to reduce the magnitude of changes of a value of the second matrix as a function of the time slice index.

5. The method of claim 1, further comprising:

selecting two or more series of overlapping time windows from the input signal;

transforming the corresponding time and amplitude values to thereby form two or more first matrices indexed by the time slices and frequencies;

performing time-domain deconvolution on the transformed amplitude values to thereby form two or more second matrices of deconvolved amplitude values;

determining a plurality of maxima and minima values in the two or more second matrices;

marking the determined plurality of maxima and minima values to thereby form a precision measuring matrix; and outputting the precision measuring matrix to thereby reveal information associated with the input signal, wherein outputting includes at least one of storing, displaying, or transmitting the precision measuring matrix.

6. A non-transitory computer readable storage medium having program instructions stored thereon that, when executed by a computer having one or more processors and one or more memory devices, cause the computer to:

receive an input signal in the form of a digital waveform signal, wherein the input signal comprises a plurality of amplitude values, and each amplitude value having a corresponding time value;

select, by a measurement engine, a series of overlapping time windows from the input signal, wherein each window has a beginning and an end, thereby defining time slices each indexed by an integer M, wherein a given time slice is a difference between the beginning of one window having index M and that of another having index M−1, or the difference between the end of one window having index M and that of another having index M−1;

transform, by the measurement engine, using a decaying exponential windowing function on each time window in the series of overlapping time windows, the corresponding time and amplitude values into a plurality of transformed amplitude values, each associated with a corresponding frequency, to thereby form a first matrix indexed by the time slices and frequencies;

perform, by the measurement engine, time-domain deconvolution on the plurality of transformed amplitude values for each frequency index to thereby form a second matrix of deconvolved amplitude values indexed by the time slices and frequencies;

determine, by a comparing engine, a plurality of maxima and minima values in the second matrix;

mark, by a marking engine, the determined plurality of maxima and minima values to thereby form a measuring matrix indexed by the time slices and frequencies; and output the measuring matrix to thereby reveal information associated with the input signal, wherein outputting includes at least one of storing, displaying, or transmitting the measuring matrix; and wherein the engines are implemented using the one or more processors of the computer.

7. The non-transitory computer readable storage medium of claim 6, wherein the program instructions further comprise computer readable code that causes the one or more processors to:

perform time-domain deconvolution, for each frequency index, by applying the following formula:

$$X_T = \frac{S_T - (1-\alpha)S_{T-1} + (1-\alpha)^N X_{T-N}}{\alpha},$$

wherein $S_T$ is a value of the first matrix, for a given frequency index, having time slice index T, $\alpha$ is a constant, and $X_T$ is a value of the second matrix having time slice index T and the same frequency index as $S_T$, and N is an integer denoting the number of time slices in the window.

8. The non-transitory computer readable storage medium of claim 6, wherein the program instructions further comprise computer readable code that causes the one or more processors to:

select the plurality of time windows by choosing the beginning or end of each time slice to coincide with amplitude values that are smaller in magnitude than a predetermined constant, wherein a difference between the beginning and end of a time slice need not be the same for each time slice.

9. The non-transitory computer readable storage medium of claim 6, wherein the program instructions further comprise computer readable code that causes the one or more processors to:

perform a weighted averaging operation, for a given value of the frequency index of the second matrix, to thereby reduce the magnitude of changes of a value of the second matrix as a function of the time slice index.

10. The non-transitory computer readable storage medium of claim 6, wherein the program instructions further comprise computer readable code that causes the one or more processors to:

select two or more series of overlapping time windows from the input signal;

transform the corresponding time and amplitude values to thereby form two or more first matrices indexed by the time slices and frequencies;
perform time-domain deconvolution on the transformed amplitude values to thereby form two or more second matrices of deconvolved amplitude values;
determine a plurality of maxima and minima values in the two or more second matrices;
mark the determined plurality of maxima and minima values to thereby form a precision measuring matrix; and
output the precision measuring matrix to thereby reveal information associated with the input signal, wherein outputting includes at least one of storing, displaying, or transmitting the precision measuring matrix.

11. A signal processing system comprising:
a computer having one or more processors and one or more memory devices;
a measurement engine configured to receive an input signal in the form of a digital waveform signal, wherein the input signal comprises a plurality of amplitude values, and each amplitude value having a corresponding time value, the measurement engine being configured to:
  select a series of overlapping time windows from the input signal, wherein each window has a beginning and an end, thereby defining time slices each indexed by an integer M, wherein a given time slice is a difference between the beginning of one window having index M and that of another having index M−1, or the difference between the end of one window having index M and that of another having index M−1,
  transform, using a decaying exponential windowing function on each time window in the series of overlapping time windows, the corresponding time and amplitude values into a plurality of transformed amplitude values, each associated with a corresponding frequency, to thereby form a first matrix indexed by the time slices and frequencies, and
  perform time-domain deconvolution on the plurality of transformed amplitude values for each frequency index to thereby form a second matrix of deconvolved amplitude values indexed by time slices and frequencies;
a comparing engine configured to determine a plurality of maxima and minima values in the second matrix;
a marking engine configured to mark the determined plurality of maxima and minima values to thereby form a measuring matrix indexed by the time slices and frequencies; and
an output module configured to output the measuring matrix to thereby reveal information associated with the input signal, wherein outputting includes at least one of storing, displaying, or transmitting the measuring matrix; and
wherein the engines are implemented using the one or more processors of the computer.

12. The system of claim 11, wherein the measurement engine is further configured to perform time-domain deconvolution, for each frequency index, by applying the following formula:

$$X_T = \frac{S_T - (1-\alpha)S_{T-1} + (1-\alpha)^N X_{T-N}}{\alpha},$$

wherein $S_T$ is a value of the first matrix, for a given frequency index, having time slice index T, $\alpha$ is a constant, and $X_T$ is a value of the second matrix having time slice index T and the same frequency index as $S_T$, and N is an integer denoting the number of time slices in the window.

13. The system of claim 11, wherein the measurement engine is further configured to select the plurality of time windows by choosing the beginning or end of each time slice to coincide with amplitude values that are smaller in magnitude than a predetermined constant, wherein a difference between the beginning and end of a time slice need not be the same for each time slice.

14. The system of claim 11, wherein the measurement engine is further configured to perform, for a given value of the frequency index of the second matrix, a weighted averaging operation to reduce the magnitude of changes of a value of the second matrix as a function of the time slice index.

15. The system of claim 11, wherein:
the measurement engine is further configured to:
  select two or more series of overlapping time windows from the input signal;
  transform the corresponding time and amplitude values to thereby form two or more first matrices indexed by the time slices and frequencies;
  perform time-domain deconvolution on the transformed amplitude values to thereby form two or more second matrices of deconvolved amplitude values;
the comparing engine is further configured to determine a plurality of maxima and minima values in the two or more second matrices; and
the marking engine is further configured to mark the determined plurality of maxima and minima values to thereby form a precision measuring matrix,
wherein the output module is further configured to output the precision measuring matrix to thereby reveal information associated with the input signal, wherein outputting includes at least one of storing, displaying, or transmitting the precision measuring matrix.

* * * * *